US006914007B2

United States Patent
Ma et al.

(10) Patent No.: US 6,914,007 B2
(45) Date of Patent: Jul. 5, 2005

(54) IN-SITU DISCHARGE TO AVOID ARCING DURING PLASMA ETCH PROCESSES

(75) Inventors: Ching-Hui Ma, Tainan (TW); Chao-Cheng Chen, Tainan (TW); Tsang-Jiuh Wu, Taichung (TW); Hui-Chang Yu, Hsin-chu (TW); Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 64 days.

(21) Appl. No.: 10/366,206

(22) Filed: Feb. 13, 2003

(65) Prior Publication Data

US 2004/0161930 A1 Aug. 19, 2004

(51) Int. Cl.[7] ............... H01L 21/302; H01L 21/462; H01L 21/461
(52) U.S. Cl. ...................... 438/707; 438/689
(58) Field of Search ............... 438/706–710, 438/716, 9, 689

(56) References Cited

U.S. PATENT DOCUMENTS

| 5,292,399 A | 3/1994 | Lee et al. ............... 156/643 |
| 5,583,737 A | * 12/1996 | Collins et al. ............... 361/234 |
| 5,895,549 A | 4/1999 | Goto et al. ............... 156/345 |
| 6,139,701 A | 10/2000 | Pavate et al. ............ 204/192.17 |
| 6,251,792 B1 | 6/2001 | Collins et al. ............... 438/710 |

* cited by examiner

Primary Examiner—Craig A. Thompson
(74) Attorney, Agent, or Firm—Haynes and Boone, LLP

(57) ABSTRACT

A method of reducing a charge on a substrate to prevent an arcing incident in a subsequent etch process is described. A patterned substrate is fastened to a chuck in a process chamber. A discharge process is performed that includes the three steps of (a) coupling the chuck to a 0 volt connection, (b) generating a plasma, and (c) coupling the chuck to a high voltage connection. The three steps are carried out in any sequence. An inert gas or an inert gas and an etching gas are flowed into the chamber during the discharge sequence. Alternatively, a fluorocarbon $C_xF_yH_z$ or a fluorocarbon and a gas such as $O_2$, $H_2$, $N_2$, $N_2O$, CO, $CO_2$, He or Ar is flowed into the chamber during the discharge sequence. The method is compatible with batch or single wafer processes and is extendable to etching low k dielectric layers with poor thermal conductivity.

42 Claims, 3 Drawing Sheets

1 = chuck coupled to 0 volt, cooling off, inert gas or inert gas + etch gas flow
2 = plasma with inert gas or etch gas, cooling off
3 = chuck coupled to hogh voltage, cooling off, inert gas or inert gas + etch gas flow

IN-SITU DISCHARGE TO AVOID ARCING DURING PLASMA ETCH PROCESSES

FIELD OF THE INVENTION

The present invention relates to a method of semiconductor manufacturing. In particular, the method involves a discharge sequence before a plasma etch process to avoid damage to substrates and equipment caused by arcing within a process chamber.

BACKGROUND OF THE INVENTION

Two methods that are repeatedly used during the fabrication of a microelectronics device are a lithography process to define a pattern in a photoresist layer and a plasma etch process to transfer the photoresist pattern into a substrate. Each new technology generation or node requires smaller features in the device pattern. These features are often filled with metal to form interconnects within and between different layers in a device. For example, in a dual damascene scheme, a trench opening is formed above a via hole in a dielectric layer and the two features are filled simultaneously with a metal such as copper or aluminum. The dielectric layer is an insulating material that typically consists of a low k dielectric material to prevent crosstalk between metal wiring. As the dimensions of the metal wiring and other device components shrink, a greater demand is placed upon the lithography and etch components of the manufacturing scheme to provide a process that is economical and reliable.

One aspect of the etching process that causes concern is charge build up on various parts of the plasma etch chamber including the upper surface of the pedestal or chuck to which a substrate is clamped during the etch step. The pedestal and clamp are usually comprised of a metal that is coated with an insulator such as quartz. However, charges can accumulate on the insulator that lead to arcing which may cause irreversible damage by dislodging portions of the substrate or forming holes in the substrate so as to render it unusable. Similarly, exposed parts within the etch chamber can become damaged by the arcing. Loss of substrates and downtime associated with repair of expensive etch equipment is quite costly. Therefore, a need exists for a means of preventing the arcing phenomenon within an etch chamber.

U.S. Pat. No. 5,292,399 describes an apparatus comprising a pedestal that has conductive plugs inserted in the upper surface to conduct charges away from a substrate. In addition, a quartz ring that surrounds the substrate on the exposed top surface of the pedestal is replaced with a conductive material such as graphite or silicide. A semiconductor material like silicon is preferred in some cases since it can be doped to adjust the resistivity of the ring or plug.

U.S. Pat. No. 6,251,792 claims an improved control of the plasma within an etch chamber by a design that includes a domed plasma reactor with an antenna that generates a high density, low energy plasma. The upper bias frequency is limited to prevent charge-up damage to sensitive devices.

As critical dimensions in devices shrink, the substrates on which the devices are fabricated tend to become larger. For example, state of the art fabs can now accommodate 300 mm wafers. In flat panel technology, large glass sheets can be difficult to process because of their size. In U.S. Pat. No. 5,895,549, a method is described for handling large substrates and an etch chamber is modified for etching at high power densities without causing arcing.

Other prior art which applies to an improved copper target for reducing defect generation during copper deposition by physical vapor deposition or high density plasma deposition is found in U.S. Pat. No. 6,139,701. This patent teaches the advantage of reducing surface roughness and using smaller Cu grain sizes to prevent arcing during plasma processing.

Arcing can result from several factors including local hot spots on a wafer, film charging, a high plasma current, and a strong local electrical field due to rough surface or improper layout. Additionally, etching, film deposition and photoresist development may cause charge build up on a substrate that leads to arcing.

A trend in the industry is the replacement of dielectric materials that have a relatively high k value such as $SiO_2$ ($k \approx 4$) with materials that have a k value of about 2.5 or less. The introduction of these new materials presents a greater challenge to avoid arcing during plasma etching due to the poor thermal conductivity of the low k dielectric layers. Therefore, a method is needed that can prevent arcing in the presence of low k dielectric layers and with substrates which have an increased amount of metallization that is characteristic of newer technology generations. Preferably, an improved method is able to release a charge build up on a wafer that can occur for a variety of reasons. More preferably, the discharge process can be performed at different points in a multiple step etch process as a preventative measure for any etch step.

SUMMARY OF THE INVENTION

An objective of the present invention is to provide a method of preventing wafer arcing during a plasma etch process.

A further objective of the present invention is to provide a method of releasing a charge on a substrate prior to beginning an etch transfer step.

A still further objective of the present invention is to provide a method of preventing arcing that can be inserted at any point in a multiple step etch process.

Yet another objective of the present invention is to provide a method of preventing arcing that is extendable to large substrates comprised of low k dielectric materials.

These objectives are achieved by providing a substrate having a layer formed thereon that comprises openings such as via holes or trenches. In one embodiment, the layer is a photoresist film with a pattern that includes openings. The photoresist may have a considerable surface charge resulting from spinning at a high rate of speed during a DI water rinse in the development sequence to form a pattern. This charging which can lead to arcing in a subsequent etch process is released in a discharge sequence prior to a plasma etch that transfers the pattern into the substrate. Three steps are performed in any sequence to release the charge and all three are done with no backside cooling on the substrate. The steps include (a) coupling the wafer chuck to a 0 voltage source, (b) generating a plasma for about 0 to 30 seconds, and (c) coupling the wafer chuck to a high voltage source.

In one embodiment, an inert gas is flowed into the chamber during the three steps. The inert gas may be combined with one or more etching gases including $O_2$, $N_2$, $H_2$, $CO_2$, CO, $N_2O$, and fluorocarbons with the formula $C_XF_YH_Z$ where X and Y are integers $\geq 1$ and H is either 0 or an integer $\geq 1$ during one or more of the three steps. In a second embodiment, a fluorocarbon gas $C_XF_YH_Z$ where X and Y are integers $\geq 1$ and H is either 0 or an integer $\geq 1$ is flowed into the chamber during the three steps. The fluorocarbon gas may be combined with one or more gases including $O_2$, $N_2$, $H_2$, $CO_2$, CO, $N_2O$, He, Ar and other fluorocarbon gases during one or more of the three steps.

The three steps in the discharge sequence may be performed before any step in a multiple step etch process. The gas flow during steps (a) and (c) is used to stabilize the chamber for a subsequent step. The method is especially beneficial when etch transferring a pattern into a low k dielectric layer that has a poor thermal conductivity and tends to produce arcing in conventional etch processes.

In another embodiment, the discharge sequence is employed one or more times in a damascene process. For example, a substrate is provided upon which an etch stop layer, dielectric lay, anti-reflective coating (ARC), and photoresist layer are sequentially formed. A via hole pattern is formed in the photoresist layer which may result in a charge build up on the substrate. The three step discharge sequence described in the first embodiment is performed and then the via opening is etch transferred through the ARC layer. Preferably, the same gas mixture used to etch through the ARC is employed in one or more steps and preferably in the last step of the first discharge sequence. A second discharge sequence similar to the first sequence may then be performed prior to etching the via pattern through the dielectric layer. In this case, the gas employed for the dielectric etch may also be used for one or more steps that preferably includes the last step in the second discharge sequence. After etch transfer through the dielectric layer, a third discharge sequence may be inserted before the etch stop is removed by a third etch process. Conventional steps such as depositing a barrier metal layer and a metal layer to fill the via and planarizing the metal layer are followed to complete the damascene process. A similar flow can be applied to a dual damascene process.

BRIEF DESCRIPTION OF THE DRAWINGS

The drawings illustrate embodiments of the invention and together with the description serve to explain the principles of the present invention.

DETAILED DESCRIPTION OF THE INVENTION

Figure 1:
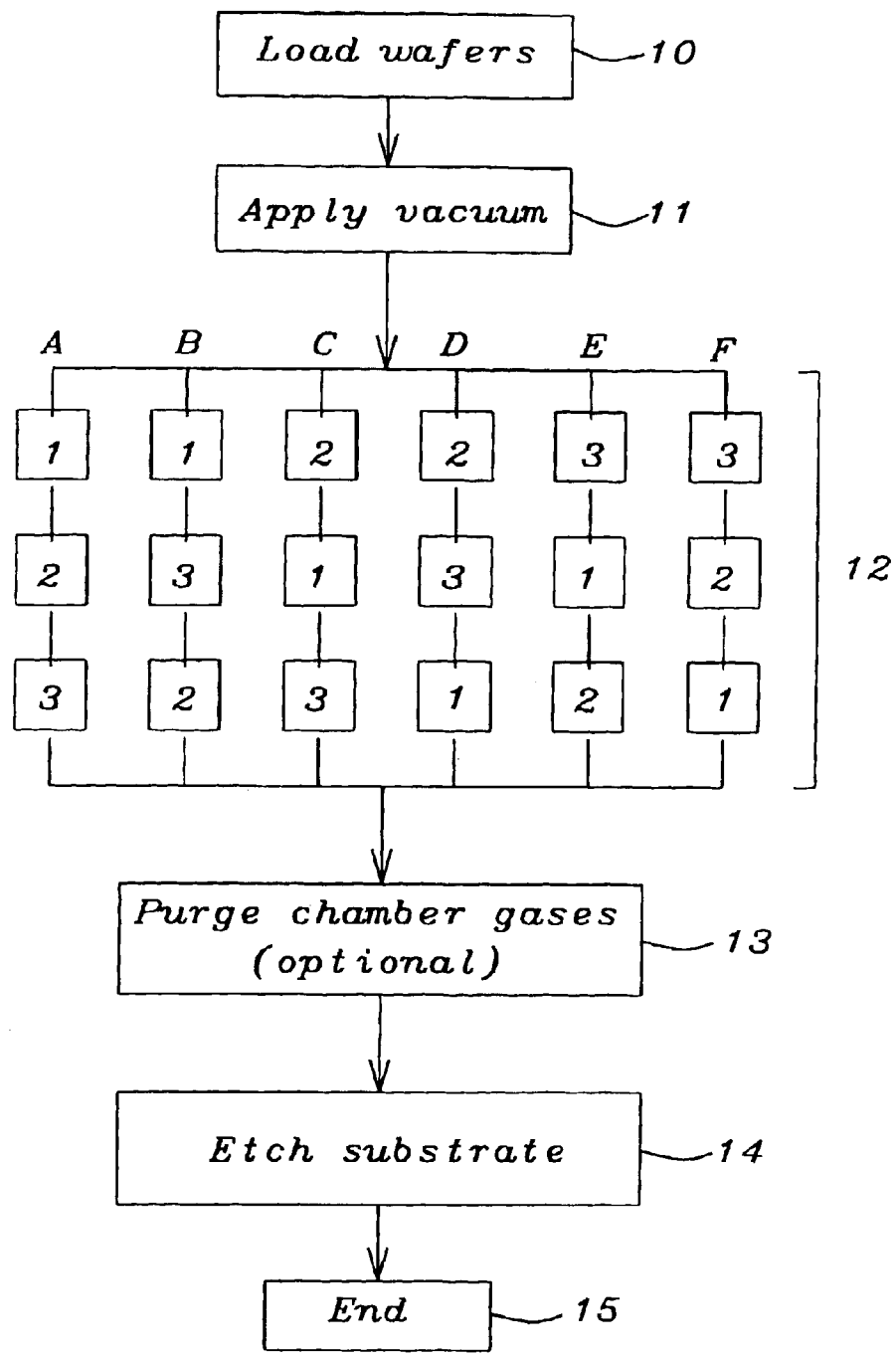
FIG. 1 is a flow diagram showing how a discharge sequence may be incorporated into an etch process.

The present invention is especially effective in preventing arcing during the etch transfer of a patterned layer into a substrate. While the drawings are intended to give a description of the embodiments, the scope of the present invention is not limited by the drawings. For example, FIGS. 2–5 are not necessarily drawn to scale. In addition, the substrate is simplified in the drawings and a substructure containing other devices and sub-layers is not shown in order to focus attention on the main points of this invention. Furthermore, the pattern is not restricted to via holes or trenches in a top photoresist layer and may include line/space arrays or other designs. The invention is applicable to any patterned top layer on a substrate. For example, in a multi-step etch process, a hard mask may remain as a top layer once a photoresist layer is removed. The hard mask layer may become charged and require a discharge sequence to prevent damage to substrate or to equipment.

Referring to FIG. 1, a flow diagram is shown that represents an etch process incorporating a discharge sequence according to the first embodiment. In step 10, one or more substrates including glass substrates for flat panel displays or wafers for fabricating semiconductor devices are loaded in a process chamber that is used for etching substrates. The substrate may have a substructure comprised of insulating and conducting layers and is provided with a patterned photoresist as a top layer (not shown). A vacuum is applied in step 11 to evacuate air and any other gases present in the chamber. The substrate is held in place by a pedestal or chuck on the underside of the substrate and a clamp that presses against the top surface which contains the photoresist pattern. Holes in the chuck allow a cooling gas to pass through the chuck and to make contact with the back side of the substrate. The cooling gas conducts heat away from the substrate during an etch process. The chuck itself is grounded to a 0 volt connection.

A key feature of the invention is the discharge sequence 12 which is a method to reduce any charge that is present on the substrate. For instance, the process that forms the photoresist pattern may result in a charged substrate. If no treatment is performed before the etch process to transfer the pattern into the substrate is initiated, then arcing can easily occur in the chamber which may result in damage to the substrate, chuck and to the process chamber.

The inventors have discovered that three events or steps must be performed to effectively reduce a charge on the substrate. The three events shown as 1, 2, and 3 in FIG. 1 can be carried out in any one of six sequences that are represented by paths A, B, C, D, E, and F in step 12. All three events 1, 2, 3 are performed while the backside cooling gas to the chuck is turned off and each event may last for several seconds. In event 1, the chuck is coupled to a 0 volt connection and in event 3 the chuck is coupled to a high voltage connection. For event 2, a plasma is generated within the chamber.

In one embodiment, an inert gas such as argon or helium is flowed into the chamber during the three steps. The flow rate for the inert gas is preferably between 200 and 800 standard cubic centimeters per minute (sccm). The inert gas may be combined with one or more etching gases including $O_2$, $N_2$, $H_2$, $CO_2$, CO, $N_2O$, and fluorocarbons with the formula $C_XF_YH_Z$ where X and Y are integers $\geq 1$ and H is either 0 or an integer $\geq 1$ during one or more of the three steps. The flow rate for an etching gas is preferably in the range of 0 to about 50 sccm. For example, argon with a flow rate of about 500 sccm may be combined with oxygen at a flow rate of about 50 sccm. In another example, $C_4F_8$ with a flow rate of about 50 sccm may be combined with Ar at a flow rate of about 500 sccm. The flow of gas into the chamber during events 1 and 3 is to stabilize the chamber for the next event or for a subsequent etch step.

During event 2, the RF power is preferably between 100 and 1000 Watts while chamber pressure is held between 20 and 150 mTorr for a 200 mm wafer or the RF power is maintained between 100 and 2000 Watts while the chamber pressure is held between 20 and 300 mTorr for a 300 mm wafer. These are preferred conditions and it should be understood that depending upon the tool set, slightly different combinations of RF power and pressure will provide optimum results. The time period required for event 2 is from 0 to about 30 seconds. It should be noted that during event 2, no etching of the photoresist layer or substrate occurs.

In another embodiment, a fluorocarbon gas $C_XF_YH_Z$ where X and Y are integers $\geq 1$ and H is either 0 or an integer $\geq 1$ is flowed into the chamber during the three steps. The fluorocarbon gas which preferably has a flow rate of between 0 and 50 sccm may be combined with one or more additional gases including $O_2$, $N_2$, $H_2$, $CO_2$, CO, $N_2O$, He, Ar and other fluorocarbon gases during one or more of the three steps. The flow rate of the additional gas is also from 0 to about 50 sccm. The same RF power, chamber pressure, and time period apply to this embodiment as was described previously for the first embodiment.

Following discharge sequence 12, the chamber is evacuated in step 13 to purge the gas employed in the final event of the discharge sequence. Step 13 may be omitted if the gas that is used during the final event of the discharge sequence 12 will also be used in the next etch step. Backside cooling is turned on and the chuck is grounded once again to the 0 volt connection.

In the etch process 14, the substrate is etched under standard conditions for transferring a pattern through a particular layer. It is understood that the etch 14 may involve a multi-step process in one chamber in which one gas mixture, RF power, and pressure are employed in one step and a different gas mixture, RF power, and pressure are used in a second and possibly third step. For example, when an anti-reflective layer (ARC) is formed on the substrate prior to coating the photoresist layer in order to improve the process latitude for the patterning step, the resulting photoresist pattern is typically first etched through the ARC using one set of etch conditions and is then etched into the substrate with a second set of etch conditions. In this case, discharge sequence 12 may be performed before the ARC etch and again prior to the substrate etch. Similarly, the discharge sequence 12 can be performed before any step in a multi-step etch sequence.

The practice of inserting discharge sequence 12 before any conventional etch step minimizes the probability that arcing will occur that can damage the substrate or etch chamber components. Discharge sequence 12 requires only a small block of time and as such does not have a significant impact on throughput. Any loss in throughput is more than compensated for by the savings realized in reducing the number of damaged substrates, increasing the device yield, and lowering the amount of downtime for damaged equipment. The discharge method is versatile and may be carried out in any etch chamber. It is effective for batch processes and for a single wafer mode that is common for handling 300 mm wafers.

In some cases, the choice of gas for the discharge sequence 12 may be a matter of convenience. For example, if the first etch step 14 after the discharge sequence 12 and chamber purge 13 is to transfer a pattern through the ARC with a gas mixture that is typically comprised of argon and oxygen, then the same gas combination could be used for the discharge process. Step 13 which is to purge gas from the chamber before initiating the etch transfer step 14 could be omitted in such a situation.

Figure 6:
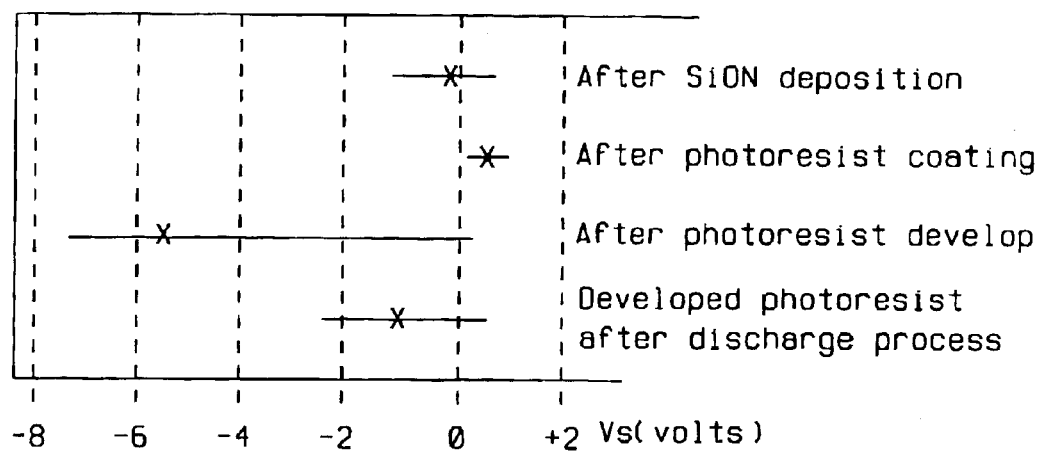
FIG. 6 is a plot of charging on a wafer after different processes are performed which demonstrate the effectiveness of the present invention.

The effectiveness of a discharge sequence 12 in reducing a charge build up on a substrate is illustrated in FIG. 6 which shows the range of surface charge (Vs) in volts associated with a particular process. The mean for each range of values is denoted by an (x). Since the inventors have found that charge build up is proportional to arcing during the etch process, a charge close to 0 volts on the substrate is desirable. As a reference, the substrate after a silicon oxynitride deposition has a surface charge in the range of about −1 to +1 volts with a mean that is nearly 0. Silicon oxynitride could be formed as an ARC on the substrate before coating the photoresist layer. After the photoresist coating process, the range of surface charging is typically from about 0 to +1 volts with a mean near the center of that range. Note the large build up in surface charge to a maximum value of −7 volts with a mean of near −5 volts when a photoresist layer is exposed and developed to form a pattern. This is believed to be caused by the high rate of spinning during the drying cycle after the substrate is rinsed with DI water. By performing the discharge sequence on the substrate with the developed photoresist pattern, the charge is reduced significantly to a range between about −2.5 volts and +0.5 volts with a mean close to −1.5 volts. This reduction in surface charge results in a dramatic drop in arcing incidents.

Figure 2:
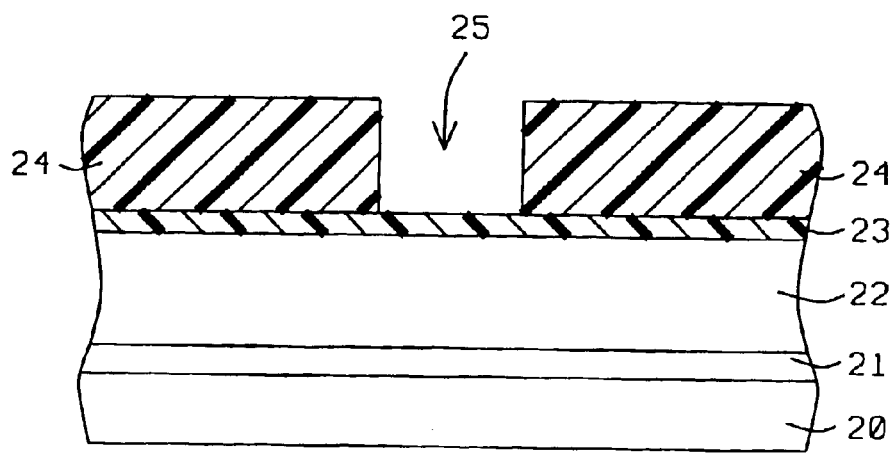
FIG. 2 is a cross-sectional view of a via hole in a photoresist pattern on a damascene stack.

In another embodiment, the method of this invention is especially useful in preventing arcing during a damascene process as depicted in FIGS. 2–5. Referring to FIG. 2, a substrate 20 is provided that typically contains a substructure (not shown) with active and passive devices and insulating and metal interconnect layers. The substrate 20 is generally silicon but can also be based on silicon-germanium or gallium-arsenide technologies. An etch stop layer 21 comprised of a material such as silicon carbide, silicon nitride, or silicon oxynitride is deposited on substrate 20 by a chemical vapor deposition (CVD) or plasma enhanced CVD method. Next a dielectric layer 22 is deposited by conventional means. Dielectric material 22 is comprised of $SiO_2$ or a low k dielectric material selected from a group including carbon doped $SiO_2$, fluorine doped $SiO_2$, polyarylethers, polysilsesquioxanes, polyimides, and fluorosilicate glass.

An ARC 23 is then formed by a CVD deposition of an inorganic material such as silicon oxynitride or by a spin-on method of a solution comprising a polymer that is cured by baking at an elevated temperature of about 180° C. to 230° C. Optionally, layer 23 is a hard mask that may also function as an ARC layer. A photoresist solution is coated and baked on ARC 23 to form a photoresist layer 24 that is patterned by conventional means to provide a via hole 25. The patterning process typically includes an exposure with one or more wavelengths selected from a range of about 10 nm to about 600 nm and developing the exposed substrate in an aqueous base solution. A DI water rinse is generally used to remove all traces of base before the substrate is dried and is sent to an etch tool for processing. A high rate of spin is usually necessary to dry the substrate as a final step in the water rinse cycle. At this point the substrate 20 is likely to have a considerable surface charge as indicated by FIG. 6 in which the photoresist film after development has a charge of up to −7 volts.

Figure 3:
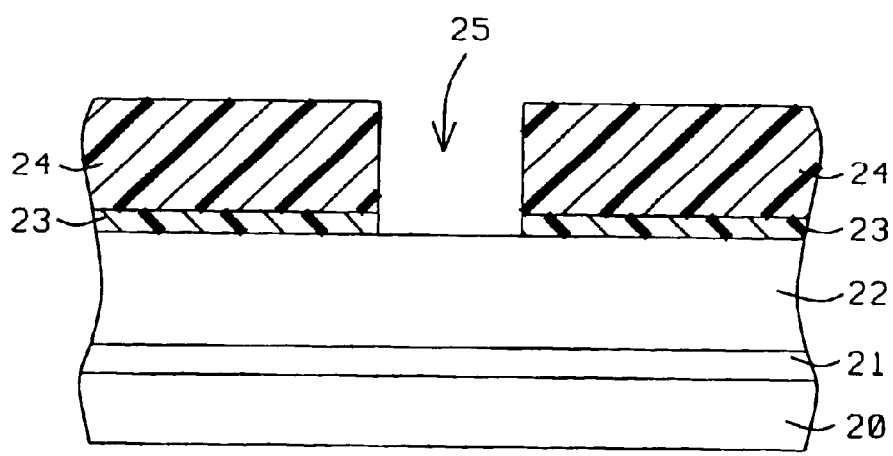
FIGS. 3–5 are cross-sectional views of the via hole in FIG. 2 as it is transferred into the damascene stack by successive etch steps.

Referring to FIG. 3, substrate 20 is subjected to a discharge method depicted by the flow diagram in FIG. 1 in which a discharge sequence 12 is performed prior to transferring the via hole 25 in photoresist 24 through ARC 23. After substrate 20 is clamped into position on a chuck, the chamber is evacuated, and backside cooling to the chuck is turned off. Three events 1, 2, 3 described previously are performed in any sequence. In one case, an inert gas such as argon or helium is flowed into the chamber during the three events. The inert gas may be combined with one or more etching gases from the group including $O_2$, $N_2$, $H_2$, $CO_2$, CO, $N_2O$, and fluorocarbons with the formula $C_XF_YH_Z$ where X and Y are integers $\geq 1$ and H is either 0 or an integer $>1$ during one or more of the three events. Alternatively, the inert gas or is replaced by a fluorocarbon gas $C_XF_YH_Z$ where X and Y are integers $\geq 1$ and H is either 0 or an integer $\geq 1$ may be flowed into the chamber during the three events. Furthermore, the fluorocarbon gas may be combined with one or more other gases including $O_2$, $N_2$, $H_2$, $CO_2$, CO, $N_2O$, Ar, He and fluorocarbons $C_XF_YH_Z$. The flow rate of an inert gas is preferably between about 200 and 800 sccm and the flow rate of an etching gas is preferably 0 to about 50 sccm during the discharge sequence.

In one example, the ARC 23 will be selectively removed in the presence of photoresist 24 by a subsequent plasma etch based on Ar and $O_2$. In this case, the discharge sequence 12 is preferably carried out with argon as the inert gas and oxygen as an etching gas since this combination will be used in the subsequent step to transfer via hole 25 through ARC 23. Conditions for generating the plasma during event 2 of the discharge sequence are an Ar flow rate of from 200 to 800 sccm and an oxygen flow rate of from 0 to 50 sccm. A RF power from 100 to 2000 Watts and a chamber pressure of from 20 to 300 mTorr for a period of 0 to 30 seconds is generally employed. Preferably, RF power is between 100 and 1000 W with a chamber pressure of 20 to 150 mTorr for 200 mm substrates or RF power is between 100 and 2000 W with a chamber pressure of 40 to 300 mTorr for 300 mm substrates during event 2. If ARC 23 is an organic layer, then step 13 is omitted and the via hole 25 is anisotropically transferred through ARC 23 by a plasma process comprised of Ar and oxygen to form via hole 25a.

When ARC 23 is an inorganic layer, then a purge step 13 may be required before the etch transfer process to transfer via opening 25 through the ARC 23 since a chemistry other than Ar/$O_2$ may be used to etch an inorganic ARC 23. As a result, via hole 25a is formed. The etch step through ARC 23 is stopped when dielectric layer 22 is detected in the etch gas effluent.

Figure 4:
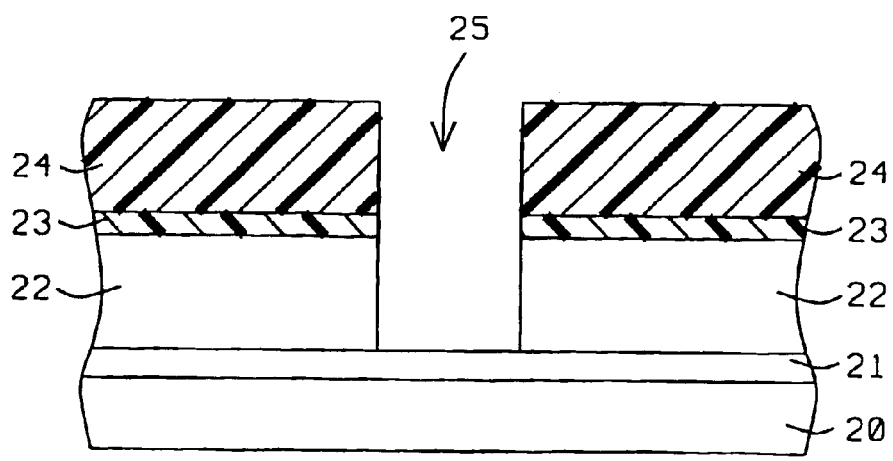

In FIG. 4, via hole 25a is transferred through dielectric layer 22. First, the discharge sequence 12 may be performed to reduce the likelihood of arcing during the etch transfer process. If dielectric layer 22 is oxide based, then the etch gas for the transfer of via hole 25a through dielectric layer 22 may include a fluorocarbon like $C_4F_8$ and an inert gas such as Ar. In that case, one or more of the three events 1, 2, 3 and at least the final event preferably employs the same gas combination of $C_4F_8$ and Ar. For example, substrate 20 is clamped into position on a chuck, the chamber is evacuated, and backside cooling is turned off. The chamber may or may not be the same one in which the ARC 23 etch was accomplished.

Next, three events 1, 2, 3 described previously may be performed with Ar as an inert gas and $C_4F_8$ as an etching gas. The plasma generated during event 2 is preferably carried out with a $C_4F_8$ flow rate of from 0 to 50 sccm and an argon flow rate of from 200 to 800 sccm. A RF power from 100 to 2000 Watts and a chamber pressure of from 20 to 300 mTorr for a period of 0 to about 30 seconds is generally employed. Preferably, RF power is between 100 and 1000 W with a chamber pressure of 20 to 150 mTorr for 200 mm substrates or RF power is between 100 and 2000 W with a chamber pressure of 40 to 300 mTorr for 300 mm substrates. The chamber is optionally purged (step 13) and via hole 25a is then anisotropically transferred through dielectric layer 22 by a plasma etch process. As a result, via hole 25b is formed. The etch step through dielectric layer 22 is stopped when etch stop layer 21 is detected in the etch gas effluent. Note that photoresist layer 24 may be completely removed by the end of the dielectric layer etch.

Figure 5:
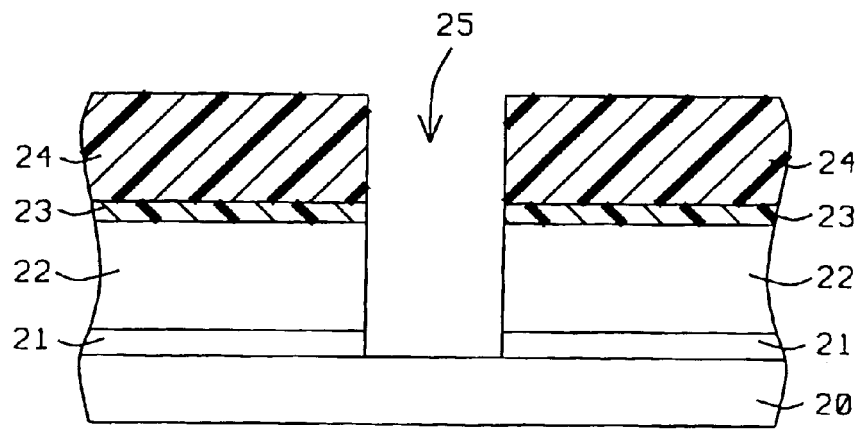

In FIG. 5, via hole 25b is transferred through etch stop layer 21 by a conventional method known to those skilled in the art to form via hole 25c. First, the discharge sequence 12 may be carried out to reduce the likelihood of arcing during the etch transfer process. Preferably, the same gas used to etch through layer 21 is also employed in the discharge sequence. When via 25c is integrated into a single damascene scheme, then any remaining layers 23, 24 are stripped by conventional means and a cleaning process may be added to ensure that no organic residues remain in via 25c. Typically, a barrier metal layer (not shown) is deposited in via 25c prior to depositing a metal layer (not shown) to fill via 25c. The metal layer is planarized by a technique such as chemical mechanical polishing to form a surface that is coplanar with dielectric layer 22.

Those skilled in the art will appreciate that the process flow shown in FIG. 1 can also be applied to a dual damascene scheme. It should be understood that the discharge process does not have to be performed before every etch step in a damascene scheme but only prior to those etch steps that have a history of producing arcing events and damage to substrates or to the process chamber and parts therein.

The discharge method of this invention should not be limited to damascene schemes. Indeed, the method is effective in reducing surface charge when performed prior to any standard etch step in which arcing is likely to occur. The method is versatile in that it prevents arcing caused by other factors such as high plasma current, a strong local electrical field due to rough surface or improper layout, and from local hot spots on a substrate. The method is also extendable to future generations of low k materials since it has been proven to be effective in reducing charges and preventing arcing during etching of porous low k dielectric materials with poor thermal conductivity.

While this invention has been particularly shown and described with reference to, the preferred embodiments thereof, it will be understood by those skilled in the art that various changes in form and details may be made without departing from the spirit and scope of this invention.

We claim:

1. A method of reducing a charge on a substrate comprising:
   providing a substrate having a patterned layer formed thereon;
   positioning said substrate on a chuck in a process chamber, said chuck having the capability of being cooled by a cooling gas;
   purging any gas from said chamber; and
   performing three steps in any order during a discharge sequence while a cooling gas to said chuck is turned off and one or more gases selected from a group including inert gases and fluorocarbons is flowed into said chamber, said three steps comprising:
   (a) coupling said chuck to a 0 volt connection;
   (b) generating a plasma; and
   (c) coupling said chuck to a high voltage connection.

2. The method of claim 1 wherein the chamber is used for a batch process or in a single substrate mode.

3. The method of claim 1 wherein the pattern is comprised of a via hole.

4. The method of claim 1 wherein said chuck is comprised of passages that enable a cooling gas to conduct heat from the back side of said substrate.

5. The method of claim 1 wherein said discharge sequence is performed while an inert gas that is argon or helium is flowed into said chamber.

6. The method of claim 5 wherein the flow rate of said inert gas is from about 200 to 800 standard cubic centimeters per minute (sccm).

7. The method of claim 5 wherein said inert gas is combined with one or more etching gases selected from a group including $H_2$, $O_2$, $N_2$, CO, $N_2O$, $CO_2$, and fluorocarbons having the formula $C_xF_yH_z$ where X and Y are integers $\geq 1$ and H is either 0 or an integer $\geq 1$.

8. The method of claim 7 wherein said inert gas is flowed at a rate between about 200 and 800 sccm and an etching gas is flowed at a rate between 0 and about 50 sccm.

9. The method of claim 8 wherein the inert gas is argon with a flow rate of about 500 sccm and the etching gas is oxygen or $C_4F_8$ with a flow rate of about 50 sccm.

10. The method of claim 1 wherein said discharge sequence is performed while a fluorocarbon $C_xF_yH_z$ where X and Y are integers $\geq 1$ and H is either 0 or an integer $\geq 1$ is flowed at a rate between 0 and about 50 sccm into said chamber.

11. The method of claim 10 wherein said fluorocarbon is combined with one or more gases selected from a group including $H_2$, $O_2$, $N_2$, CO, $N_2O$, $CO_2$, He, Ar and $C_xF_yH_z$ where X and Y are integers $\geq 1$ and H is either 0 or an integer $\geq 1$.

12. The method of claim 1 wherein said plasma is generated with an RF power of between about 100 and 2000 Watts and with a chamber pressure of about 20 to 300 mTorr for a period of 0 to about 30 seconds.

13. The method of claim 1 further comprised of purging said chamber after said three steps (a), (b), and (c) are performed and then transferring said pattern into said substrate with a plasma etch process.

14. The method of claim 1 further comprised of transferring said pattern into said substrate in said chamber with a plasma etch comprising the gas used in step (a), (b), or (c) after said discharge sequence is performed.

15. A damascene method comprising:
   providing a substrate with a stack of layers comprised of a bottom etch stop layer, a middle dielectric layer, and a top anti-reflective coating (ARC) formed thereon;
   patterning a photoresist layer on said ARC;
   positioning said substrate on a chuck in a process chamber;
   purging any gas from said chamber;
   performing three steps in any order during a discharge sequence while a cooling gas to said chuck is turned off and one or more gases selected from a group including inert gases and fluorocarbons is flowed into said chamber, said three steps comprising:
   (a) coupling said chuck to a 0 volt connection;
   (b) generating a plasma; and
   (c) coupling said chuck to a high voltage connection, and
   transferring an opening into said dielectric layer with a plasma etch process.

16. The method of claim 15 further comprising:
   removing said etch stop layer at the bottom of said opening in said dielectric layer;
   depositing a barrier metal layer in said opening;
   depositing a metal layer to fill said opening; and
   planarizing said metal layer to become coplanar with said dielectric layer.

17. The method of claim 16 wherein said etch stop layer is comprised of silicon carbide, silicon nitride, or silicon oxynitride.

18. The method of claim 15 wherein said dielectric layer is $SiO_2$ or a low k dielectric material selected from a group including carbon doped $SiO_2$, fluorine doped $SiO_2$, polyarylethers, polysilsesquioxanes, polyimides, and fluorosilicate gas.

19. The method of claim 15 wherein said ARC is comprised of an organic polymer or is an inorganic layer.

20. The method of claim 15 wherein said discharge sequence is performed while an inert gas that is argon or helium is flowed into said chamber.

21. The method of claim 20 wherein the flow rate of said inert gas is from about 200 to 800 sccm.

22. The method of claim 20 wherein said inert gas is combined with one or more gases selected from a group including $H_2$, $O_2$, CO, $N_2O$, $CO_2$, and $C_xF_yH_z$ where X and Y are integers $\geq 1$ and H is either 0 or an integer $\geq 1$.

23. The method of claim 15 wherein said discharge sequence is performed while a fluorocarbon $C_xF_yH_z$ where X and Y are integers $\geq 1$ and H is either 0 or an integer $\geq 1$ is flowed into said chamber at a rate from 0 to about 50 sccm.

24. The method of claim 23 wherein said fluorocarbon is combined with one or more gases selected from a group including $H_2$, $O_2$, $N_2$, CO, $N_2O$, $CO_2$, He, Ar and fluorocarbons $C_xF_yH_z$ where X and Y are integers $\geq 1$ and H is 0 or an integer $\geq 1$.

25. The method of claim 15 wherein said plasma during the discharge sequence is generated with an RF power of between about 100 and 2000 Watts and with a chamber pressure of about 20 to 300 mTorr for a period of 0 to about 30 seconds.

26. The method of claim 15 wherein the plasma etch transfer of said opening through said ARC is comprised of the gas that is flowed through said chamber during said steps (a), (b), or (c) of said discharge sequence.

27. The method of claim 15 wherein said chamber is purged after said steps (a), (b), and (c) are performed and before the etch transfer of said pattern into said dielectric layer is initiated.

28. The method of claim 15 wherein a second discharge sequence of steps (a), (b), and (c) is performed after an etch transfer process through said ARC and before etching into said dielectric layer.

29. The method of claim 28 wherein the plasma etch through said dielectric layer comprises a fluorocarbon gas and said fluorocarbon gas is also used in one or more steps (a), (b), and (c) in said second discharge sequence.

30. The method of claim 16 wherein a third discharge sequence of steps (a), (b), and (c) is performed after etching through said dielectric layer and prior to removal of said etch stop layer.

31. The method of claim 30 wherein the plasma etch through said etch stop layer is comprised of the same gas that is used in one or more steps (a), (b), and (c) in said third discharge sequence.

32. A method of reducing a charge during a semiconductor manufacturing process, comprising:
  placing a substrate over a chuck; and
  performing one or more steps selected from three steps in any order, wherein the three steps comprise:
    coupling the chuck with a 0 volt connection;
    generating a plasma; and
    coupling the chuck with a high voltage source.

33. The method of claim 32 further comprising flowing at least one gas into a chamber wherein the chamber is for hosting the substrate and the chuck.

34. The method of claim 33 wherein the gas comprises an inert gas.

35. The method of claim 34 wherein the inert gas is combined with one or more etching gases.

36. The method of claim 33 wherein the gas comprises a fluorocarbon gas.

37. The method of claim 36 wherein the fluorocarbon gas is combined with one or more gases.

38. The method of claim 32 wherein the substrate comprises at least one opening.

39. The method of claim 32 wherein the substrate comprises at least one via opening.

40. The method of claim 32 wherein the substrate comprises at least one trench opening.

41. The method of claim 32 wherein the performing is implemented during a damascene process.

42. The method of claim 41 wherein the performing is implemented prior to transferring a via hole through a dielectric layer.

* * * * *